(12) United States Patent
Guidash

(10) Patent No.: US 6,587,146 B1
(45) Date of Patent: Jul. 1, 2003

(54) THREE TRANSISTOR ACTIVE PIXEL SENSOR ARCHITECTURE WITH CORRELATED DOUBLE SAMPLING

(75) Inventor: Robert M. Guidash, Rochester, NY (US)

(73) Assignee: Eastman Kodak Company, Rochester, NY (US)

(*) Notice: Subject to any disclaimer, the term of this patent is extended or adjusted under 35 U.S.C. 154(b) by 0 days.

(21) Appl. No.: 09/197,364

(22) Filed: Nov. 20, 1998

(51) Int. Cl.⁷ .................................. H04N 3/14; H04N 5/335
(52) U.S. Cl. ....................... 348/308; 348/302; 348/241; 257/239; 257/291
(58) Field of Search ............................... 348/241, 302, 348/308; 257/291, 239; 377/60

(56) References Cited

U.S. PATENT DOCUMENTS

| | | | |
|---|---|---|---|
| 5,471,515 A | 11/1995 | Fossum et al. | 377/60 |
| 5,587,596 A | 12/1996 | Chi et al. | 257/223 |
| 5,608,243 A | 3/1997 | Chi et al. | 257/249 |
| 5,625,210 A | 4/1997 | Lee et al. | 257/292 |
| 6,049,357 A * | 4/2000 | Shinohara | 348/308 |

* cited by examiner

*Primary Examiner*—Wendy R. Garber
*Assistant Examiner*—Matthew L Rosendale
(74) *Attorney, Agent, or Firm*—Peyton C. Watkins

(57) ABSTRACT

An active pixel sensor having a plurality of pixels with at least one pixel comprising: a photodetector operatively connected to a first electrical node; a pixel signal coupling capacitor having a first side connected to the first electrical node and a second side connected to a second electrical node; a reset transistor having a first source that is connected on the first electrical node and a second source that it connected to the second electrical node; a reset gate on the reset transistor connected to a reset control buss and a drain on the reset transistor connected to a voltage supply buss; an amplifier operatively connected to the second electrical node; and a select transistor operatively coupled to the amplifier. The preferred embodiment of the invention has a gate electrode layer formed over at least a portion of the photodetector and functions also as the gate of the transistor amplifier. It is envisioned by the preferred embodiment that the gate electrode layer be either polysilicon or indium tin oxide (ITO) which are materials typically used as gate electrode materials.

22 Claims, 3 Drawing Sheets

THREE TRANSISTOR ACTIVE PIXEL SENSOR ARCHITECTURE WITH CORRELATED DOUBLE SAMPLING

FIELD OF THE INVENTION

This invention relates to the field of solid state photosensors and imagers referred to as Active Pixel Sensors (APS) that have active circuit elements associated with each pixel, and more specifically to Solid State Imagers that employ correlated double sampling (CDS).

BACKGROUND OF THE INVENTION

APS are solid state imagers wherein each pixel contains the typical solid state pixel elements including a photo-sensing means, reset means, a charge to voltage conversion means, and additionally all or part of an amplifier. The photocharge collected within the pixel is converted to a corresponding voltage or current within the pixel as discussed in prior art documents such as "Active Pixel Sensors: Are CCD's Dinosaurs?", SPIE Vol. 1900-08-8194-1133 July 1993, by Eric Fossum. APS devices have been operated in a manner where each line or row of the imager is selected and then read out using a column select signal as discussed by E. Fossum in "Active Pixel Sensors: Are CCD's Dinosaurs?", SPIE Vol. 1900-08-8194-1133 July 1993 and by R. H. Nixon, S. E. Kemeny, C. O. Staller, and E. R. Fossum, in "128×128 CMOS Photodiode-type Active Pixel Sensor with On-chip Timing, Control and Signal Chain Electronics". Proceedings of the SPIE vol. 2415, Charge-Coupled Devices and Solid-State Optical Sensors V, paper 34 (1995). The selection of rows and columns within an Active Pixel Sensor is analogous to the selection of words and bits in memory devices. Here, the selection of an entire row would be analogous to selecting a word and the reading out of one of the columns of the Active Pixel Sensor would be analogous to selecting or enabling a single bit line within that word. Conventional prior art devices teach architectures employing 3 transistor designs, where the 3 transistors are typically Row Select, Reset, and Source Follower Amplifier transistors. While this architecture provides the advantages of yielding APS devices having a reasonably high pixel fill factor, it does not provide the capability to easily perform CDS. CDS is a technique that provides referencing of the signal level of a pixel to the reset level of that pixel. In order to perform CDS, the pixel must first be reset and the reset level of the pixel readout prior to integration or photocharge collection within that pixel. Next incident light results in photoelectrons being generated within the photodetector resulting in a signal charge that is accumulated within the pixel, which can then be read out. This results because the photodetector is also a charge to voltage conversion means. When the photodetector is reset, the charge in the photodetector is removed via the pixel supply voltage and cannot be recovered. This technique reduces the temporal noise of the sensor, providing a higher signal to noise ratio and better image quality.

Prior art devices that perform CDS employing 3 transistor based pixels, typically first read out and store an image frame comprising a reset level for each pixel on the sensor. Next the signal frame is captured and read out. The reset level frame stored in memory must then be subtracted from the signal frame at each pixel to provide a pixel signal level that is referenced to the pixel reset level prior to integration. Prior art designs using 4 transistor pixels have been devised that enable CDS without the need to capture and store a separate reset frame, but the 4 transistor cells have the shortcoming of having a lower fill factor and lower sensitivity than 3 transistor pixels.

In addition, prior art 4T pixel designs can produce an artifact called image lag where all of the photoelectrons cannot be read out in a single frame, and appear as a ghost or residual image in the next frame. The signal swing in 4T pixels is also limited and less than that of 3T pixel designs due to the restriction of prevention of charge sharing between the photodetector and floating diffusion during readout.

Typical prior art APS pixels are shown in FIGS. 1a and 1b. The pixel in FIG. 1a is a prior art 3 transistor pixel that comprises: a photodetector (PDET), that can be either a photodiode (PD) or a photogate (PG); reset transistor with a reset gate (RG); row select transistor with a row select gate, (RSG); and a source follower input signal transistor (SIG). The pixel in FIG. 1b is a prior art 4 transistor pixel and comprises a photodetector (PDET); that can be either a photodiode (PD) or photogate (PG); a transfer gate (TG); a floating diffusion (FD); reset transistor with a reset gate (RG); row select transistor with a row select gate, (RSG); and source follower input signal transistor (SIG). As stated above it is difficult to perform CDS using the prior art 3 transistor pixel architecture. The photodetector is also used as the charge to voltage conversion node within prior art 3 transistor pixel. In order to obtain the pixel reset level prior to signal integration, the reset level of the entire frame must be read out and stored in memory prior to commencing integration. If one were to reset the photodetector prior to integration, read the reset level, then integrate and read the signal level, that entire sequence would have to be done one row at a time. Hence if the desired integration time were 30 msec., each row would have to be independently and separately integrated for 30 msec. If there were 1000 rows in the image sensor, a frame with 30 msec. integration time would take 30 seconds to capture. In addition, any changes in illumination of the scene or motion of objects in the scene within the 30 seconds would produce an undesirable image artifact in the form of image tear, blur and shading.

In the 4 transistor pixel, since the photodetector is separated from the charge to voltage conversion node (floating diffusion, FD) by an extra transistor, the floating diffusion can be reset, and the reset level of the floating diffusion can be read immediately prior to transferring the signal charge onto the floating diffusion. Thus CDS can be accomplished without separate and non-overlapping integration periods for each and every row. However the area required to implement the $4^{th}$ transistor reduces the fill factor of the pixel compared to the 3 transistor pixel.

It should be readily apparent that there remains a need within the art to provide an alternate pixel architecture that has high fill factor, no lag, large image signal swing, and the capability to perform CDS without the need to capture and store entire frames of image data in order to be able to subtract a separate reset frame from each signal level frame, or to have separate and non-overlapping integration periods for each row of the sensor.

SUMMARY OF THE INVENTION

The present invention provides a means to perform Correlated Double Sampling, (CDS), within a 3 transistor, Active Pixel Architecture. This is done by AC coupling the photodetector signal to the input of the source follower in the pixel, and providing a means to clamp the input of source follower to a reference signal.

The present invention addresses the needs within the prior art by providing an Active Pixel Sensor having a plurality of pixels with the pixel designed having a photodetector operatively connected to a first electrical node on a signal coupling capacitor with the opposite side of the signal coupling capacitor connected to a second electrical node and a reset configuration that applies predetermined potentials to the first and second electrical nodes upon reset. The preferred embodiment applies a voltage supply to these nodes upon reset and allows the voltage on the first node connected to the photodetector to accumulate charge during the time period following reset. The second electrical node is allowed to float following reset so the accumulated charge is saved on the capacitor with reference to the predetermined potentials. An amplifier is operatively connected to the second electrical node to sense and read out the signal from the second electrical node. In the preferred embodiment, a reset transistor having two sources connected to each the first and second electrical nodes is employed, however, two reset transistors can also perform the same function. The signal capacitor is preferably formed by overlapping a portion of the photodetector with an extension of the amplifier gate electrode.

ADVANTAGEOUS EFFECT OF THE INVENTION

The present invention provides true Correlated Double Sampling (CDS) using only 3 transistors resulting in a higher fill factor. The advantage gained is high fill factor, lower temporal noise, lag free, and large signal swing, and voltage scaling in deep sub-$\mu$ CMOS. No disadvantages foreseen.

BRIEF DESCRIPTION OF THE DRAWINGS

FIG. 4b is a cross-sectional view along B–B' of the pixel in FIG. 4a.

DETAILED DESCRIPTION

Figure 1A:
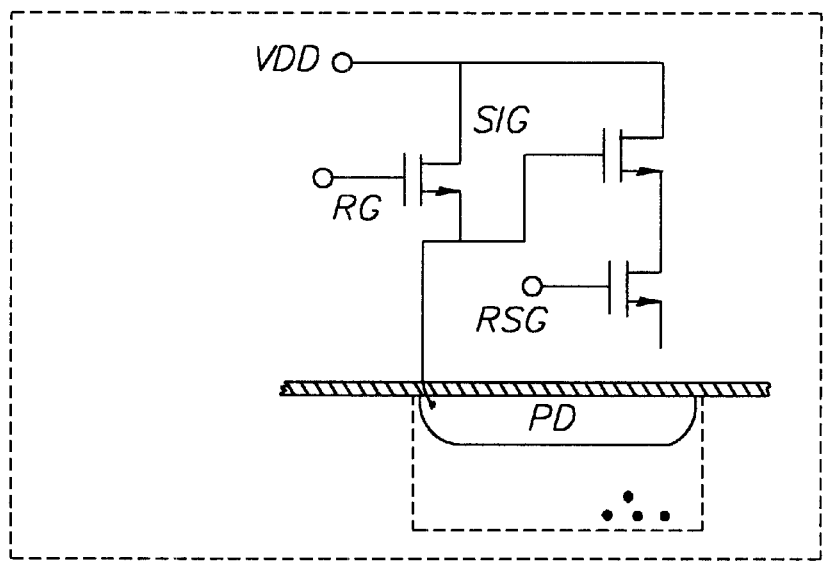
FIG. 1a is a prior art architecture for a three transistor Active Pixel Sensor pixel.
Figure 1B:
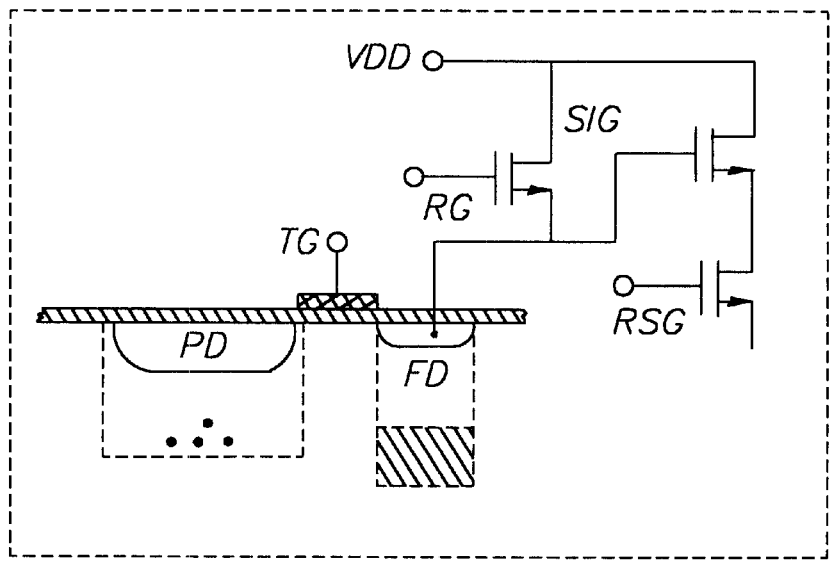
FIG. 1b is a prior art architecture for a four transistor Active Pixel sensor pixel.
Figure 2:
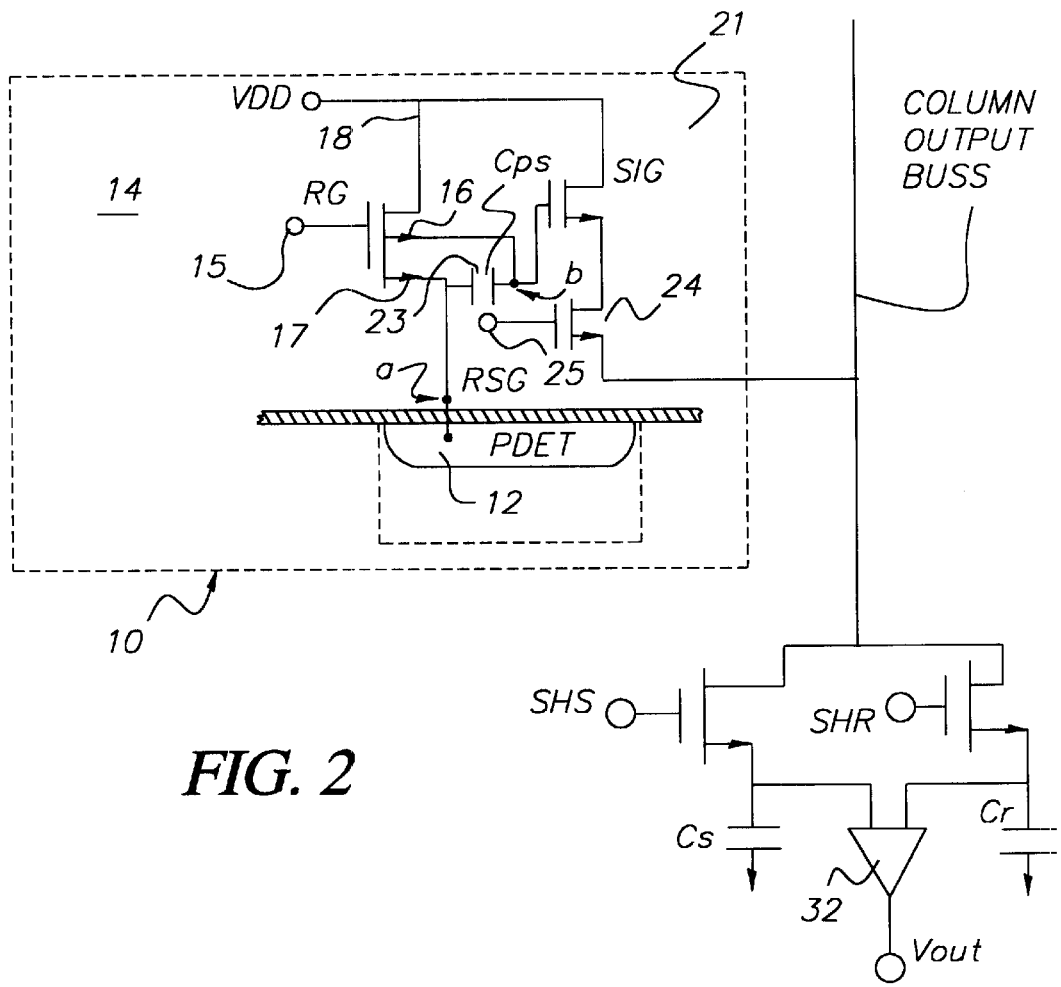
FIG. 2 is three transistor architecture for a three transistor Active Pixel Sensor pixel.

FIG. 2 is a schematic illustration of the 3 transistor pixel architecture for an Active Pixel Sensor (APS) as envisioned by the present invention. The embodiment shown in FIG. 2 envisions the best mode known to inventor. Other physical embodiments are realizable that are obvious variations of the embodiment shown in FIG. 2, as will be discussed further blow. The pixel 10 shown in FIG. 2 is a single pixel within an array of pixels having numerous rows and columns.

As seen in FIG. 2, the pixel 10 comprises: a photodetector 12 (PDET) that can be constructed employing either a photodiode or a photogate; a reset transistor 14 with a reset gate 15 (RG), a row select transistor 24 with a row select gate, (RSG) 25; a source follower input signal transistor 21 (SIG), and a pixel signal coupling capacitor 23 (Cps). The reset transistor 14 has a single gate 15 and drain 18 but 2 separate sources, 16,17. Source 17 is connected to same electrical node as PDET 12 on the "a" side of Cps 23, and the other source 16 is input to the gate of SIG 21 on the "b" side of Cps 23.

Figure 3:
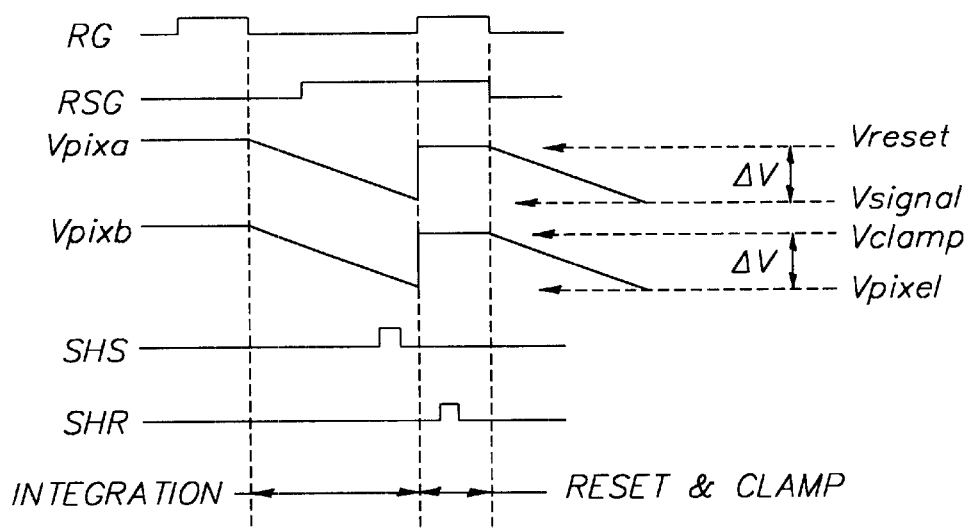
FIG. 3 is a timing diagram illustrating the operation of the pixel shown in FIG. 2.

Referring to FIG. 3, which is a timing diagram used to describe the operation of the 3 transistor pixel shown in FIG. 2, the operation of the new pixel architecture for FIG. 2 will described. The embodiment described herein will be in the case where the photodetector 12 is a photodiode (PD). It should also be understood that the pixel operation described takes place for an entire row of pixels 10. Initially, the photodetector 12 which is connected to node "a", and node "b" which is the input node for source follower signal transistor 21, are reset by applying an "on-voltage" to the gate 15 of reset transistor 14, (RG goes high). This resets the photodiode (PD) used as photodetector 12 and clamps the source follower input at node "b" of Cps 23 to a potential level essentially equal to VDD (which is the supply voltage). The voltage at node "a" is the reset level of the PD 12, referred to as $V_{rst}$. The voltage at node "a" is labeled on the timing diagram as Vpixa and the voltage at node "b" is shown as Vpixb. After the reset signal is removed from the reset gate, node "b" is left floating, and the voltage across of Cps 23 is VDD−Vrst. Vrst should be very close to the value of VDD, but because of Johnson noise in the rest transistor, there may be some slight deviation.

The reset gate 15 is then turned off, (RG goes low), and the integration period for photodetector 12 begins. With the reset gate 15 of reset transistor 14 turned off, photoelectrons begin to fill up the photodetector 12. As a result, the voltage on the photodetector 12, which is attached to node "a", Vpixa decreases from its reset level by some amount, $\Delta V$, that is proportional to the amount of incident light, the integration time, and the capacitance of the photodiode 12 (PD). Since the side of capacitor Cps 23 connected to node "b" is left floating after reset gate 15 is turned off, the charge stored on the plate of capacitor Cps 23 attached to node "b" cannot change and the voltage across Cps 23, which is referenced to the pixel reset level Vrst, must remain constant. Accordingly, the potential of node "b" (Vpixb) will also change by $\Delta V$. This $\Delta V$ is that value related to the signal, referred to herein as Vsig. The voltage on node "b" then becomes (VDD−Vsig). The row select transistor 24 is turned on at the end of the integration period by addressing the row select gate 25 to go high and allows the signal level that has accumulated within photodetector 12 during the integration period to be read and stored on column capacitor Cs 45. The storing of the integrated signal into capacitor Cs 45 is controlled by strobing sample and hold signal SHS 44, (SHS goes high then low).

This signal level is (VDD−Vsig) as discussed above. Thus, the signal level that is stored on Cs 45 is referenced to the reset level of the photodiode 12 prior to commencing integration and is equal to [$A_v$(VDD−Vsig+Voffset)]. Voffset is the offset voltage of the source follower, and $A_v$ is the voltage gain of the source follower. Next, the reset gate 15 is pulsed on again to clamp the source follower input to VDD and reset the photodiode (PD) 12. While the reset gate 15 is still on and the input to the pixel source follower is clamped to VDD, the output signal level is stored on column capacitor Cr 47 by strobing sample and hold signal reset (SHR) 46. This signal level stored on Cr 47 is (VDD+Voffset). The Reset Gate 15 to Reset Transistor 14 is then turned off to commence integration for that row for the next frame. The initial signal level stored on Cs 45 is then read differentially through difference amplifier 32 with respect to the clamped level stored on Cr 47 in order to cancel the pixel source follower offset voltage. Vout=[$A_v$(VDD−Vsig+Voffset)]−[$A_v$(VDD+Voffset)]=$A_v$(−Vsig.)

From the description of operation provided it is evident that this pixel architecture provides true CDS output signal without the need for storing a reset frame, and without the need for independent and separate integration periods for each row. Also, since the signal is integrated in addition to the reset level and signal charge is not transferred from the photodetector in order to read the signal level, this pixel will not have decay lag.

Figure 4A:
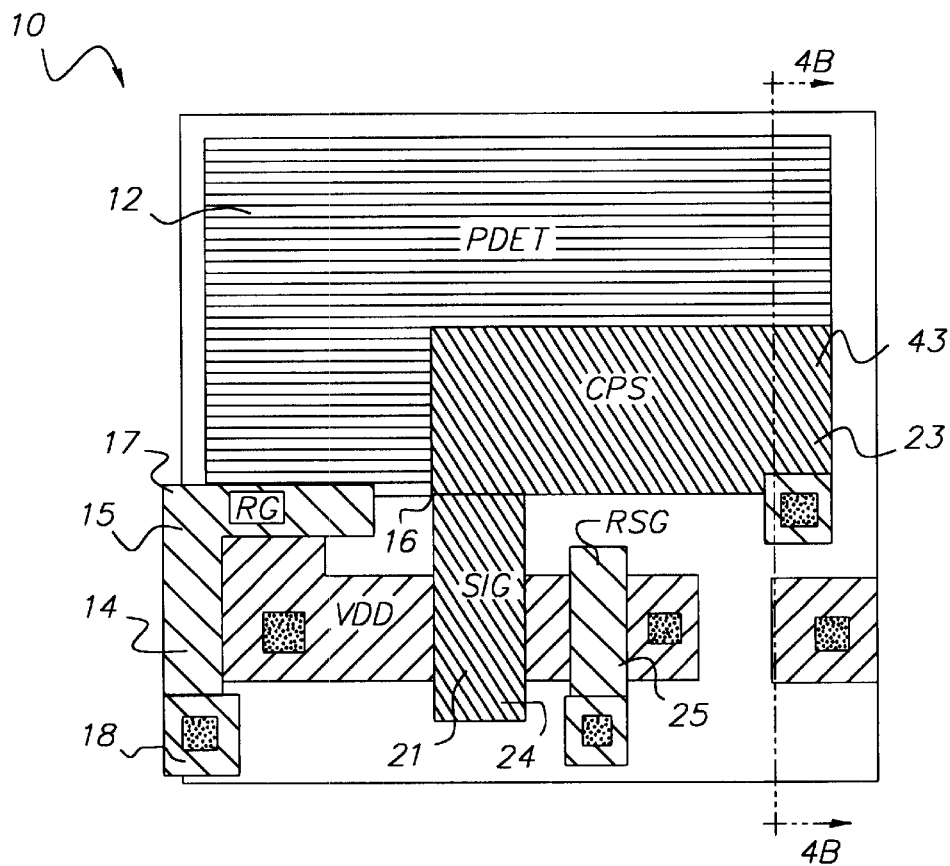
FIG. 4a, is a top view of the physical embodiment of the pixel in FIG. 2.

FIG. 4a is a top view of the physical embodiment of the pixel in FIG. 2. As in FIG. 2 the pixel 10 in FIG. 4 comprises: a photodetector 12 (PDET) that can be constructed employing either a photodiode or a photogate; a reset transistor 14 with a reset gate 15 (RG), a row select transistor with 24 a row select gate, (RSG) 25; a source follower input signal transistor 21 (SIG), and a pixel signal coupling capacitor 23 (Cps). The reset transistor 14 has a single gate 15 and drain 18 but 2 separate sources, 16,17. Source 17 is connected to same electrical node as PDET 12 on the "a" side of Cps 23, and the other source 16 is input to the gate of SIG 21 on the "b" side of Cps 23. For simplicity and ease of view, the metal interconnect layers have been omitted from FIG. 4a, but are easily ascertained from the pixel schematic in FIG. 2 and top view layout in FIG. 4.

Still referring to FIG. 4a, signal capacitor (Cps) 23 is seen over PDET 12. This illustrates the top view of the preferred embodiment, wherein the bottom plate, or side "a" of Cps 23 is formed by the photodetector, and the top plate, or side "b" of Cps 23 is formed by extending over the photodetector, the polysilicon gate comprising the source follower input gate. The 2 sides of Cps 23 are separated by the gate oxide layer 66 between SIG 21 and PDET 12. The fill factor of this pixel layout is comparable to that of standard prior art 3T pixel architectures.

Figure 4B:
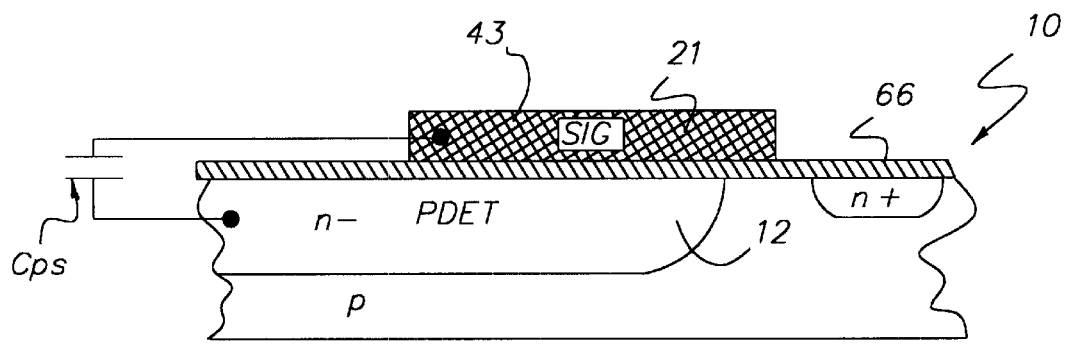

Referring now to FIG. 4b which is a cross-sectional view along B–B' of the pixel in FIG. 4a, Cps 23 is formed by extending the layer used to form the gate electrode of SIG 21 over at least a portion of PDET 12. It is envisioned by the preferred embodiment that layer 43 be polysilicon, the material used to form gate electrodes in standard high volume sub-$\mu$m CMOS processes. The gate oxide layer 66 could also be formed of indium tin oxide (ITO), or other gate electrode material that is fully transparent in the visible light spectrum, to provide better blue transmission compared to that of polysilicon.

The foregoing description details the embodiments most preferred by the inventor. Variations of these embodiments will be readily apparent to those skilled in the art. Accordingly, the scope of the invention should be measured by the appended claims.

PARTS LIST 10 pixel
14 reset transistor
15 reset gate
16 reset source
17 reset source
18 reset drain
21 source follower transistor
23 capacitor
24 row select transistor
25 row select gate
32 difference amplifier
43 layer
44 SHS sample hold signal transistor
45 CS signal storage capacitor
46 SHR sample hold reset transistor
47 CR reset storage capacitor
66 gate oxide layer

What is claimed is:

1. An active pixel sensor having a plurality of pixels with at least one pixel comprising:
    a photodetector operatively connected to a first electrical node;
    a pixel signal coupling capacitor having a first side connected to the first electrical node and a second side connected to a second electrical node;
    a reset transistor having a first source that is connected to the first electrical node and a second source that is connected to the second electrical node;
    a reset gate on the reset transistor connected to a reset control buss and a drain on the reset transistor connected to a voltage supply buss; and
    an amplifier operatively connected to the second electrical node.

2. The invention of claim 1 wherein the amplifier is a source follower amplifier coupled to a select transistor such that enabling the select transistor provides the source follower output signal corresponding to the magnitude of the second electrical node voltage onto an output signal buss.

3. The invention of claim 1 wherein further comprising a select transistor is a row select transistor that provides the amplifier output signal corresponding to the magnitude of the second electrical node voltage onto an output signal buss.

4. The invention of claim 1 wherein application of a predetermined signal to the reset gate resets the first electrical node and the photodetector to a predetermined first potential, the second electrical node to a predetermined second potential, and application of a second predetermined signal to the reset gate allows the second side of the capacitor on the second electrical node to float while the photodetector connected to the first electrical node is allowed to collect charge.

5. The invention of claim 4 wherein the first side and the second side of the capacitor store any change in potential after application of the second predetermined signal to the reset gate.

6. The invention of claim 1 wherein the reset transistor having a first source and second source is replaced with a first reset transistor having the first source and a second reset transistor having the second source.

7. The invention of claim 1 wherein the signal coupling capacitor is formed by the photodetector, and a polysilicon layer overlapping at least a portion of the photodetector, and separated from the photodetector by a dielectric layer.

8. The invention of claim 1 further comprising an indium tin oxide (ITO) electrode operatively connected to the photodetector to control the photodetector potential level.

9. The invention of claim 1 wherein the signal coupling capacitor is formed by the photodetector, and an indium tin oxide (ITO) layer overlapping at least a portion of the photodetector, and separated from the photodetector by a dielectric layer.

10. An active pixel sensor having a plurality of pixels with at least one pixel comprising:
    a photodetector having a reset mechanism operatively connected to a first side of a capacitor at a first electrical node;
    a second side of the capacitor that is operatively coupled to the reset mechanism at a second electrical node;
    means for activating the reset mechanism such that the first and the second electrical nodes are set to respective first and second potentials; and an amplifier operatively connected to the second electrical node; and wherein application of a predetermined signal to the reset mechanism resets the first electrical node and the photodetector to a predetermined first potential, the second electrical node to a predetermined second potential, and application of a second predetermined signal to the reset mechanism allows the second side of the capacitor on the second electrical node to float while the photodetector connected to the first electrical node is allowed to collect charge.

11. The active pixel sensor of claim 10 wherein the reset means further comprise:

a reset transistor having a first source that is connected on the first electrical node and a second source that is connected to the second electrical node; and a reset gate on the reset transistor connected to a reset control buss and a drain on the reset transistor connected to a supply voltage buss.

12. The invention of claim 10 wherein the amplifier is a source follower amplifier coupled to a select means which comprise a select transistor such that enabling the select transistor provides the source follower output signal corresponding to the magnitude of the second electrical node voltage onto an output signal buss.

13. The invention of claim 12 further comprising a select transistor that is a row select transistor that provides the source follower output signal corresponding to the magnitude of the second electrical node voltage to a column output signal buss.

14. The invention of claim 10 wherein the first side and the second side of the capacitor store any change in potential after application of the second predetermined signal to the reset gate.

15. The invention of claim 10 wherein the signal coupling capacitor is formed by the photodetector, and a polysilicon layer overlapping at least a portion of the photodetector, and separated from the photodetector by a dielectric layer.

16. The invention of claim 10 further comprising an indium tin oxide (ITO) electrode operatively connected to the photodetector to control the photodetector potential level.

17. The invention of claim 10 wherein the signal coupling capacitor is formed by the photodetector, and an indium tin oxide (ITO) layer overlapping at least a portion of the photodetector, and separated from the photodetector by a dielectric layer.

18. The invention of claim 10 wherein the reset mechanism further comprises a first transistor and a second transistor coupled respectively to the first and second electrical nodes.

19. A method of making an active pixel sensor:

providing a pixel having a photodetective element operatively coupled to reset means and amplification means;

AC coupling the photodetective element and the amplification means by a capacitive element that is electrically connected to the reset means on both sides of the capacitive element such that each side of the capacitive element is on a separate electrical node;

forming means for resetting both sides of the capacitive element to corresponding potentials; and creating means for amplifying the potential stored on the capacitive element.

20. The method of claim 19 wherein the step of forming further comprises forming a reset transistor having a first source connected to a first side of the capacitive element and a second source connected to a second side of the capacitive element.

21. The method of claim 19 herein the step of placing further comprises placing a polysilicon layer over at least a portion of the photodetective element, separated from the photodetective element by a dielectric, and connected to the amplification means.

22. The method of claim 19 wherein the step of placing further comprises an ITO layer over at least a portion of the photodetective element, separated from the photodetective element by a dielectric, and connected to the amplification means.

* * * * *

UNITED STATES PATENT AND TRADEMARK OFFICE
CERTIFICATE OF CORRECTION

PATENT NO. : 6,587,146 B1  
DATED : July 1, 2003  
INVENTOR(S) : Robert M. Guidash It is certified that error appears in the above-identified patent and that said Letters Patent is hereby corrected as shown below:

<u>Column 8,</u>
Line 29, replace the word "herein" with the word -- wherein --.

Signed and Sealed this

Fourth Day of November, 2003

JAMES E. ROGAN
*Director of the United States Patent and Trademark Office*